(12) United States Patent
Jeon et al.

(10) Patent No.: US 8,058,877 B2
(45) Date of Patent: Nov. 15, 2011

(54) CIRCUIT FOR MEASURING BATTERY VOLTAGE AND METHOD FOR BATTERY VOLTAGE MEASUREMENT USING THE SAME

(75) Inventors: Ywun Seok Jeon, Seoul (KR); Bon Woong Ku, Incheon (KR)

(73) Assignee: KEFICO Corporation

( * ) Notice: Subject to any disclaimer, the term of this patent is extended or adjusted under 35 U.S.C. 154(b) by 435 days.

(21) Appl. No.: 12/447,002

(22) PCT Filed: Mar. 26, 2007

(86) PCT No.: PCT/KR2007/001457
§ 371 (c)(1),
(2), (4) Date: Apr. 24, 2009

(87) PCT Pub. No.: WO2008/054048
PCT Pub. Date: May 8, 2008

(65) Prior Publication Data
US 2010/0026308 A1    Feb. 4, 2010

(30) Foreign Application Priority Data
Oct. 31, 2006    (KR) .................. 10-2006-0106299

(51) Int. Cl.
*G01N 27/416* (2006.01)
(52) U.S. Cl. ..................... 324/429; 320/166
(58) Field of Classification Search .................. 324/429; 320/166
See application file for complete search history.

(56) References Cited

U.S. PATENT DOCUMENTS 6,639,408 B2   10/2003   Yudahira et al.
6,803,766 B2 *  10/2004   Kobayashi et al. ........... 324/434

FOREIGN PATENT DOCUMENTS

| | | |
|---|---|---|
| DE | 600 24 753 T2 | 7/2006 |
| DE | 601 22 088 T2 | 1/2007 |
| JP | 2001-116776 | 4/2001 |
| JP | 2001-289886 A | 10/2001 |
| JP | 2002-139523 A | 5/2002 |
| JP | 2003-14792 A | 1/2003 |
| JP | 2005-292137 A | 10/2005 |
| KR | 20-0330157 | 10/2003 |
| KR | 10-2007-005315 | 1/2007 |

* cited by examiner

*Primary Examiner* — Bot Ledynh
(74) *Attorney, Agent, or Firm* — Dickstein Shapiro LLP

(57) ABSTRACT

The present invention relates to circuit for measuring battery voltage and method for battery voltage measurement using the same. In the circuit for measuring battery voltage and method for battery voltage measurement using the same, three or more capacitors, which form a closed loop and are sequentially connected, are provided, and voltages of voltage sources are measured by using the three or more capacitors in turn, which prevents measurement errors from occurring due to residual charges in the capacitors and enables more precise measurement. Further, according to the present invention, since the three or more capacitors are alternately charged and discharged, the delay in time is decreased, and the voltages of the plurality of voltage sources can be measured at one time. Therefore, it is possible to reduce the amount of time required to measure battery voltage.

8 Claims, 6 Drawing Sheets

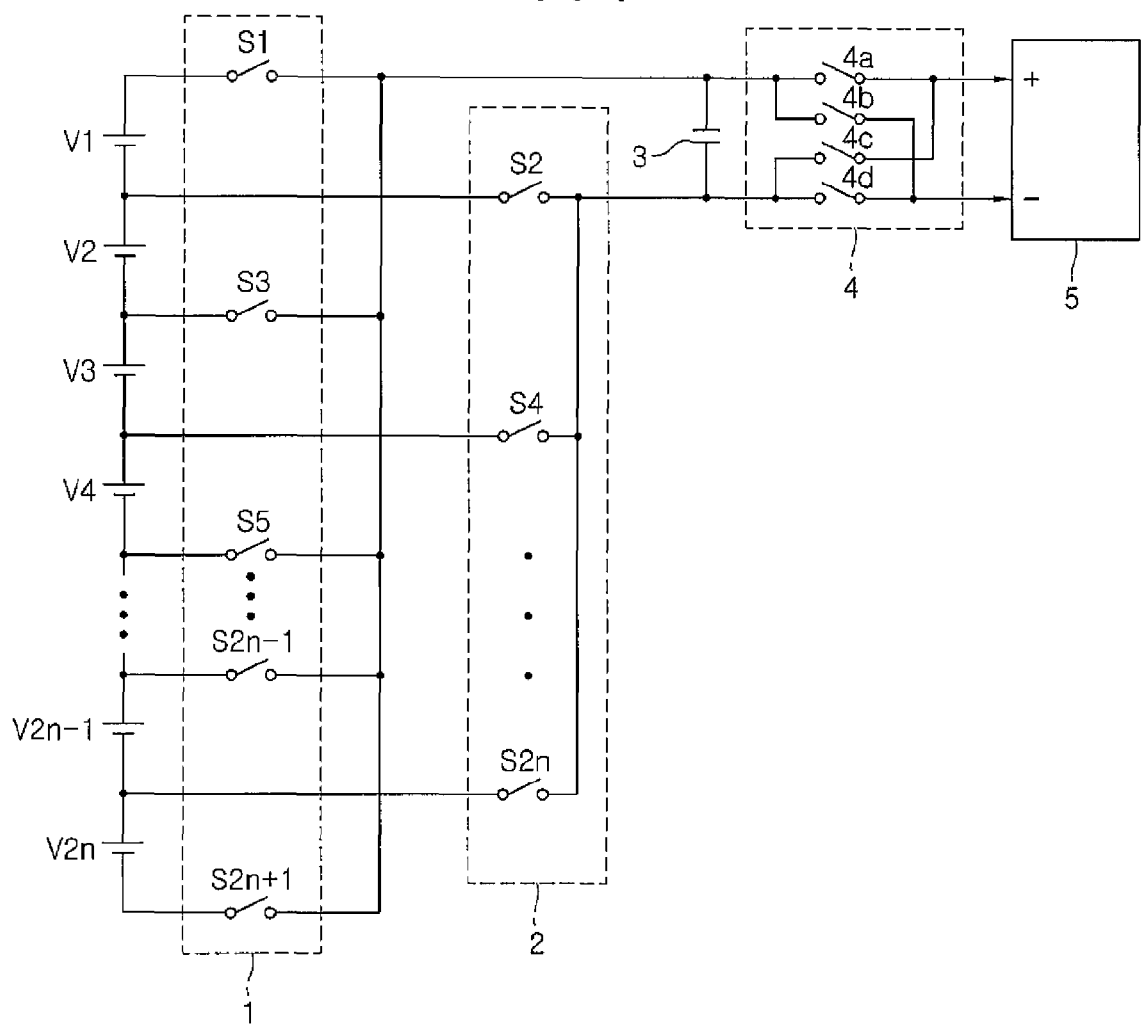
[Fig. 1]

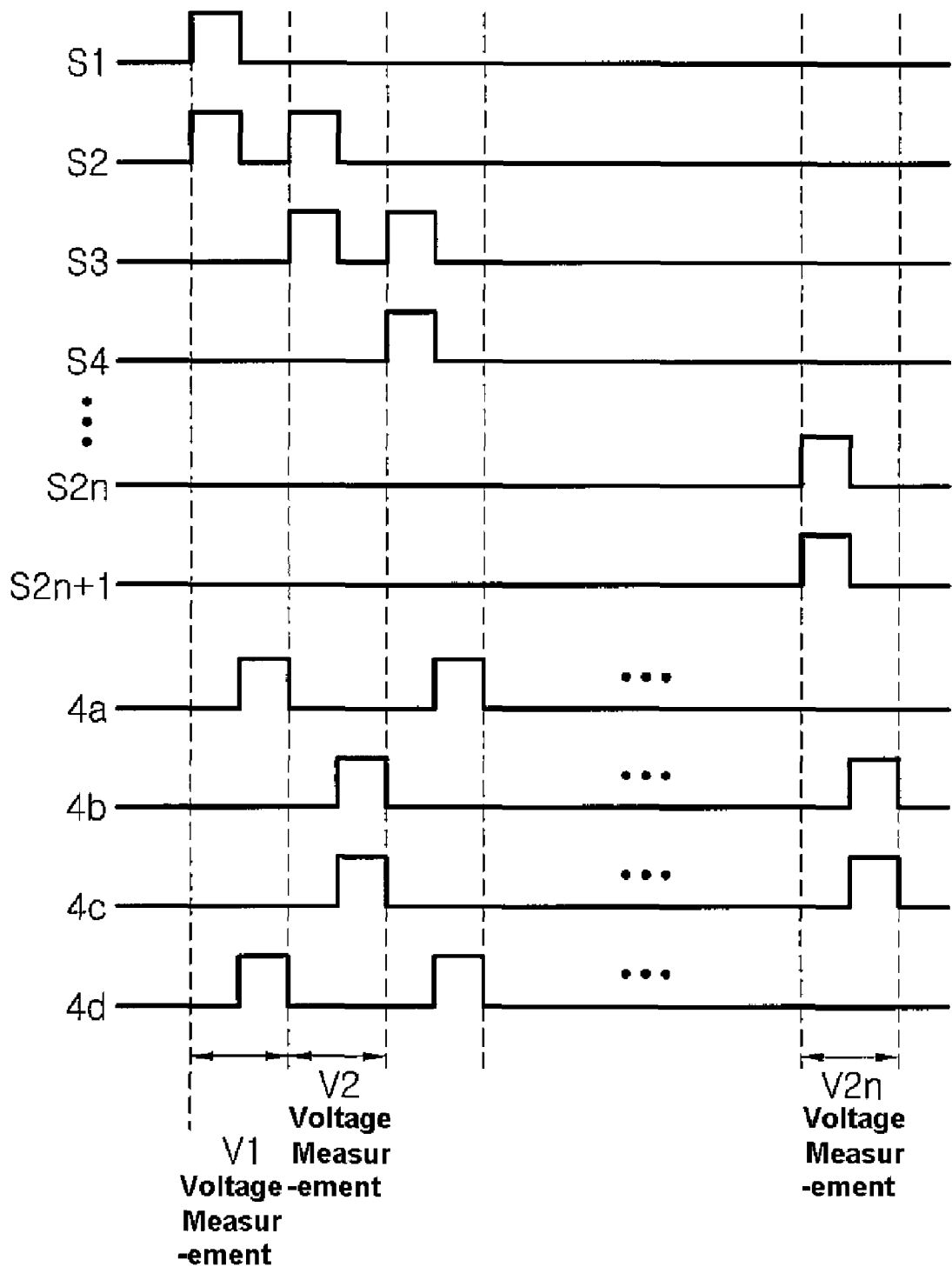

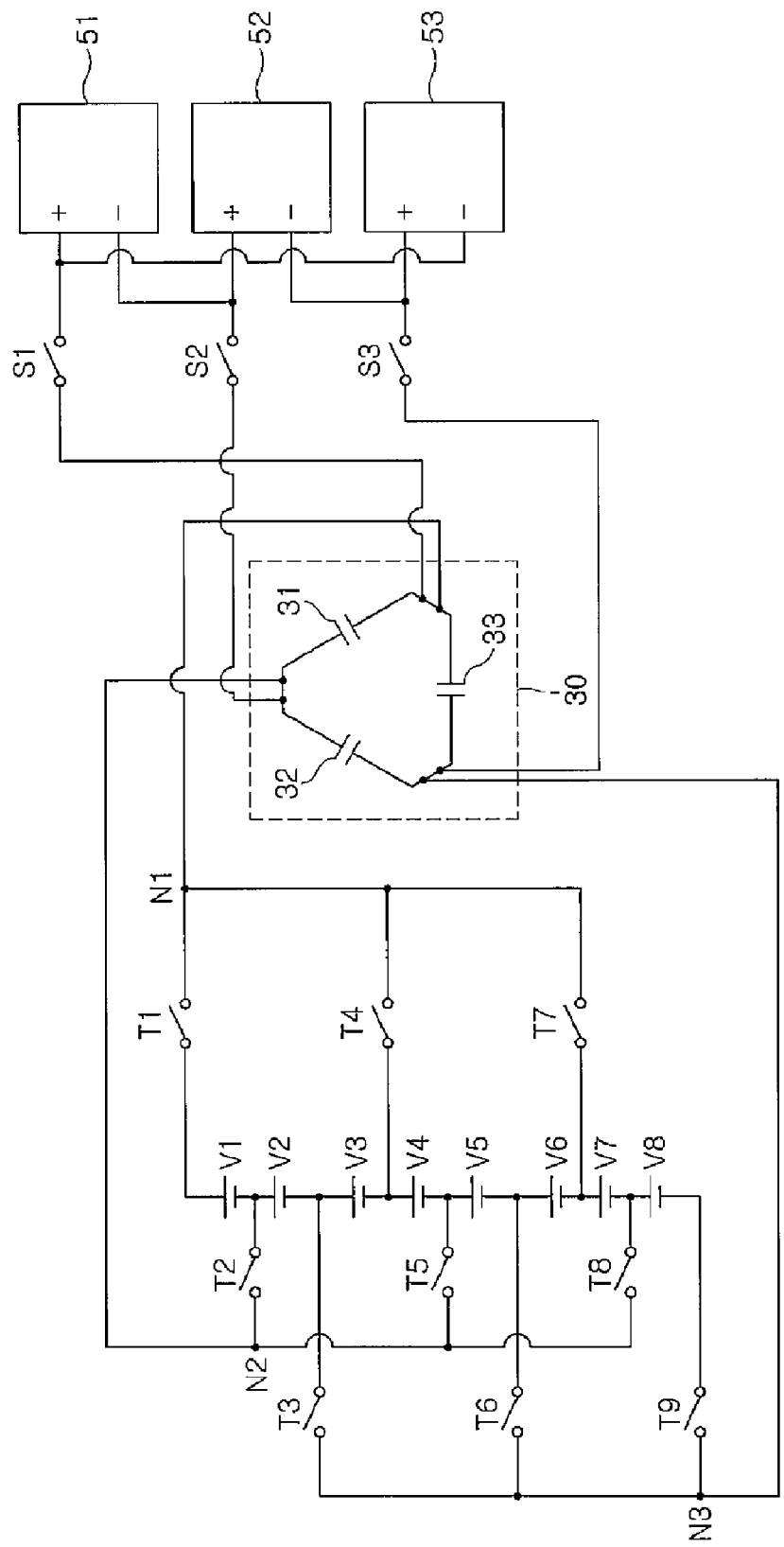
[Fig. 3]

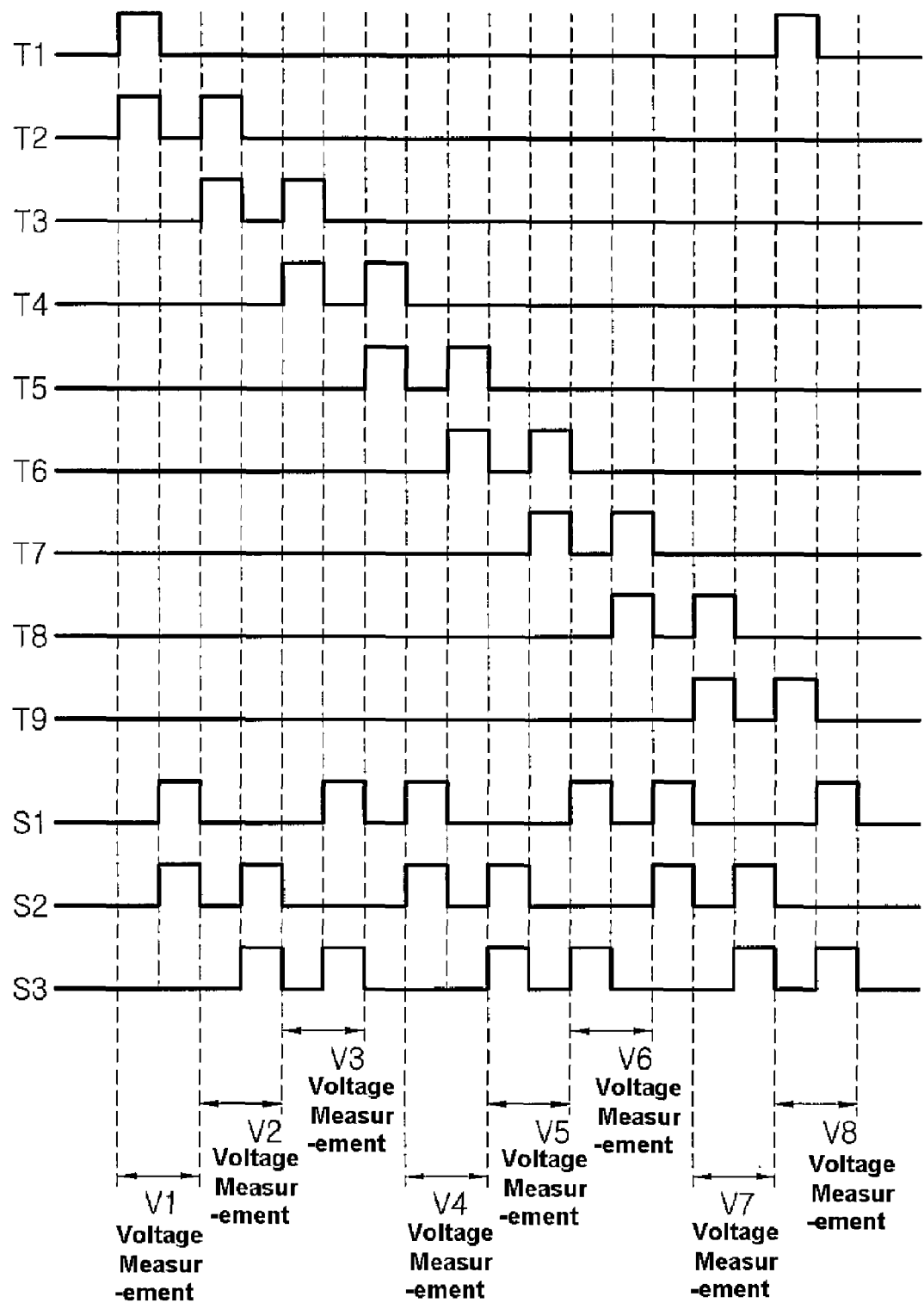

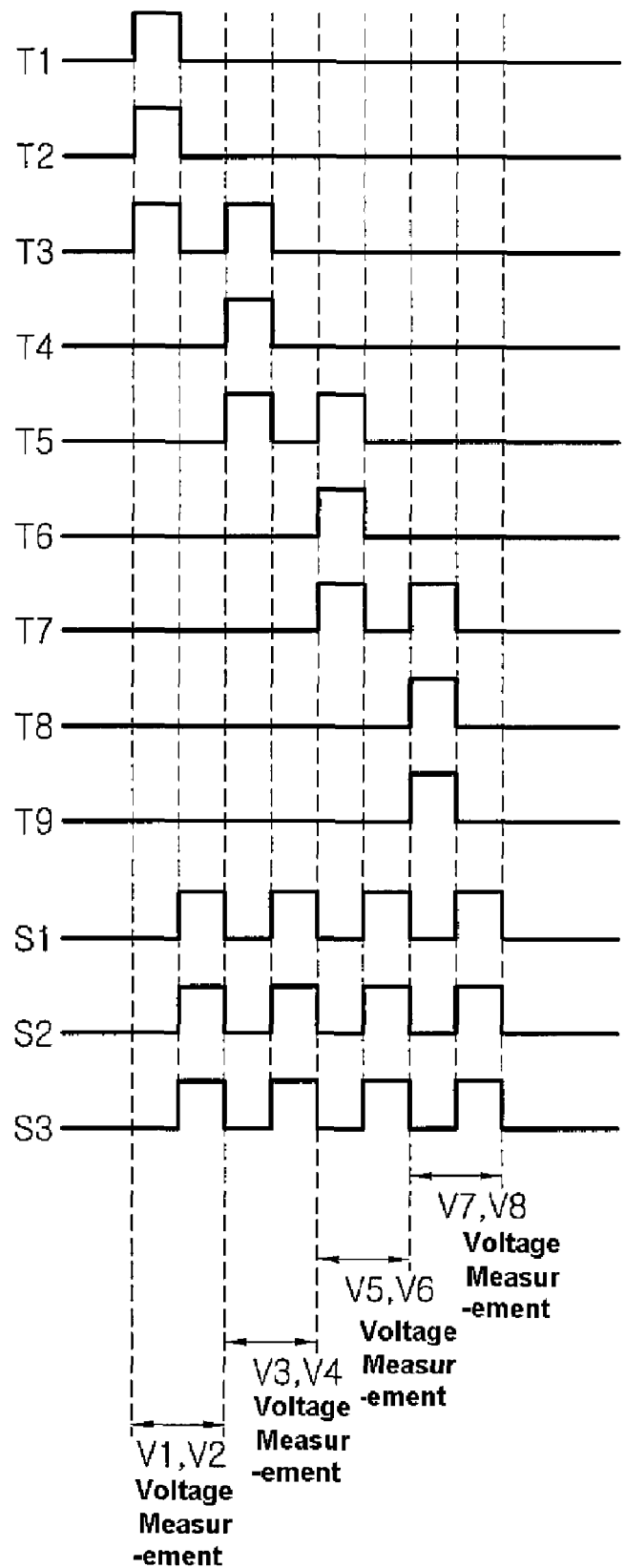

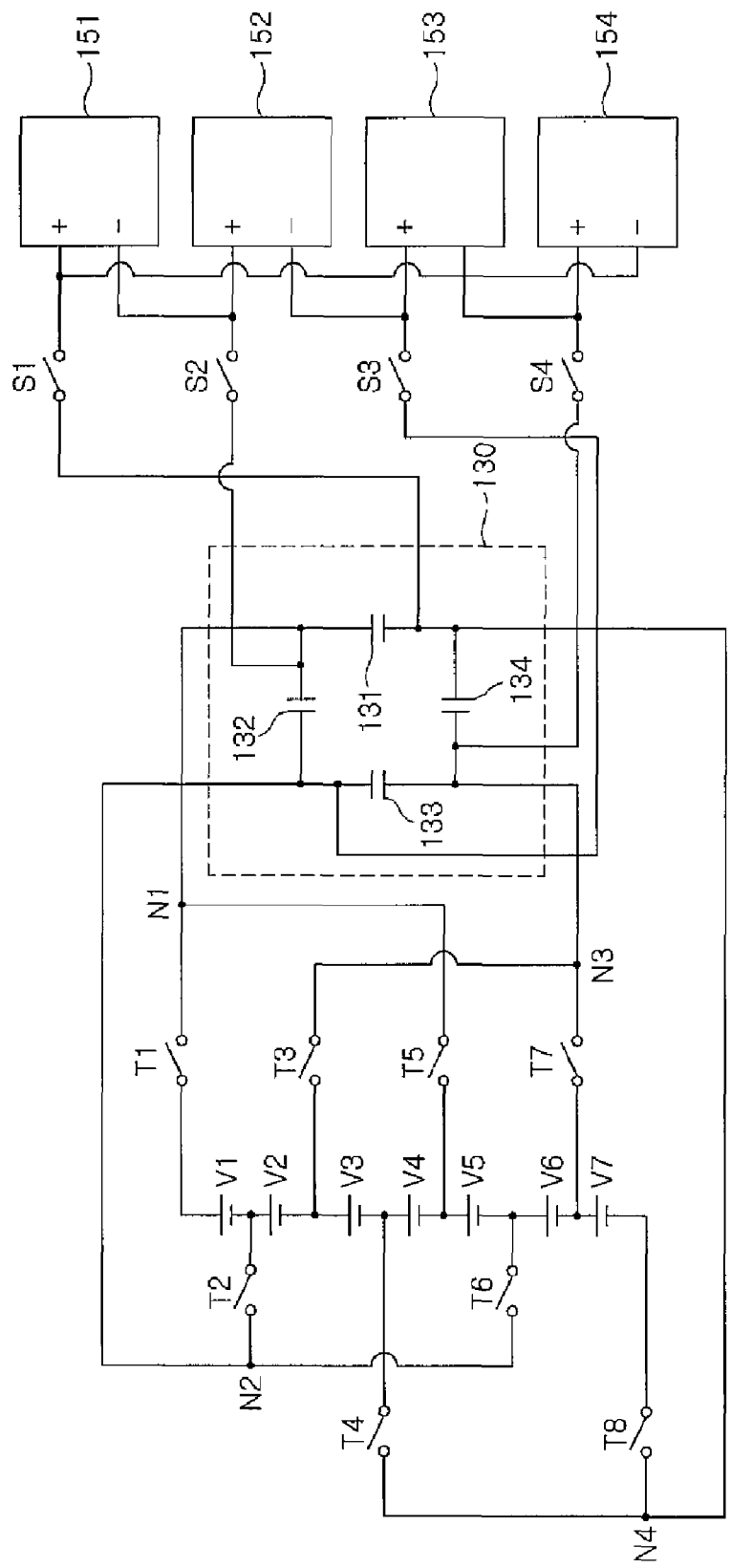
[Fig. 6]

US 8,058,877 B2

CIRCUIT FOR MEASURING BATTERY VOLTAGE AND METHOD FOR BATTERY VOLTAGE MEASUREMENT USING THE SAME

TECHNICAL FIELD

The present invention relates to circuit for measuring battery voltage and method for battery voltage measurement using the same. More particularly, the present invention relates to a circuit for measuring battery voltage and a method of measuring battery voltage using the same which are capable of accurately measuring the battery voltage and reducing an amount of time to measure battery voltage.

BACKGROUND ART

Generally, a battery includes a plurality of voltage sources that are connected in series to one another, and voltage of the battery is calculated by measuring voltages from the plurality of voltage sources that are connected in series to one another and summing the measured voltages. Accordingly, the circuit for measuring battery voltage according to the related art that measures a battery voltage includes circuits for measuring the voltages from the plurality of voltage sources, respectively.

FIG. 1 is a circuit diagram illustrating the circuit for measuring battery voltage according to the related art.

Referring to FIG. 1, the circuit for measuring battery voltage according to the related art includes first to 2n voltage sources V1 to V2n (where n is a natural number of 1 or more) that are connected in series to one another, and a first switching bank 1 that has input terminals connected to odd-numbered voltage sources V1 to V2n−1 among the first to 2n voltage sources V1 to V2n.

The circuit for measuring battery voltage according to the related art further includes a second switching bank 2 that has input terminals connected to even-numbered voltage sources V2 to V2n among the first to 2n voltage sources V1 to V2n, a capacitor 3 that has one terminal connected to an output terminal of the first switching bank 1 and the other terminal connected to an output terminal of the second switching bank 2, a voltage measuring unit 5 that measures a voltage charged into the capacitor 3, and a sampling switching unit 4 that connects the capacitor 3 and the voltage measuring unit 5.

The first switching bank 1 includes the odd-numbered switching elements S1 to S2n+1, and the second switching bank 2 includes the even-numbered switching elements S2 to S2n.

The sampling switching unit 4 includes a first sampling switching element 4a that connects one terminal of the capacitor 3 and the positive voltage input terminal (+) of the voltage measuring unit 5, a second sampling switching element 4b that connects one terminal of the capacitor 3 and the negative voltage input terminal (−) of the voltage measuring unit 5, a third sampling switching element 4c that connects the other terminal of the capacitor 3 and the positive voltage input terminal (+) of the voltage measuring unit 5, and a fourth sampling switching element 4d that connects the other terminal of the capacitor 3 and the negative voltage input terminal (−) of the voltage measuring unit 5.

A method of measuring a battery voltage using the circuit for measuring battery voltage according to the related art will be described in detail below with reference to FIG. 2.

According to the method of measuring battery voltage according to the related art, first, a first switching element S1 of the first switching bank 1 and a second switching element S2 of the second switching bank 2 are turned on so as to charge the voltage of the first voltage source V1 into the capacitor 3.

Then, the first sampling switching element 4a and the fourth sampling switching element 4d are turned on, and the voltage of the first voltage source V1 is measured by the voltage measuring unit 5.

Then, the first switching element S1 of the first switching bank 1 and the second switching element S2 of the second switching bank 2 are turned off so as to discharge the voltage of the first voltage source V1 charged into the capacitor 3.

Then, the second switching element S2 of the second switching bank 2 and a third switching element S3 of the first switching bank 1 are turned on so as to charge the voltage of the second voltage source V2 into the capacitor 3.

Then, the second sampling switching element 4b and the third sampling switching element 4c are turned on, and the voltage of the second voltage source V2 is measured by the voltage measuring unit 5.

Then, the second switching element S2 of the second switching bank 2 and the third switching element S3 of the first switching bank 1 are turned off so as to discharge the voltage of the second voltage source V2 charged into the capacitor 3.

According to the method of measuring battery voltage according to the related art, after the voltages of the first to 2n voltage sources V1 to V2n are sequentially measured by repeating the above-described method, the sequentially measured voltages of the first to 2n voltage sources V1 to V2n are summed so as to calculate a total voltage that is charged into the battery.

DISCLOSURE OF INVENTION

Technical Problem

However, the circuit for measuring battery voltage according to the related art that has the above-described structure measures voltage of each voltage source using a single capacitor. Therefore, in order to accurately measure voltage of each voltage source, the capacitor needs to be sufficiently discharged for each period until a voltage of a next voltage source is measured after a voltage of one voltage source is measured.

Accordingly, in the circuit for measuring battery voltage according to the related art, the switching elements are turned off so as to discharge the capacitor for each period. However, since the single capacitor is continuously charged and discharged within a short cycle, the following problem occurs. Residual charges that are not completely discharged from the capacitor are accumulated in the capacitor, and thus measured erroneous voltage values are continuously accumulated as voltage measurement is repeated and the number of times the voltages are measured is increased.

Further, since it takes time to discharge the capacitor for each period, an amount of time to measure voltages is increased as the number of voltage sources is increased.

The present invention has been made to solve the above-described problems, and it is an object of the present invention to provide a circuit for measuring battery voltage and a method of measuring battery voltage using the same that are capable of preventing measurement errors from occurring due to residual charges in a capacitor and reducing the amount of time to measure the battery voltage.

Technical Solution

In order to achieve the above-described objects, circuit for measuring battery voltage according to a preferred embodiment of the present invention includes a battery that is composed of k voltage sources connected in series to one another, (k+1) switching elements, includes the k switching elements being sequentially connected to positive poles of the k voltage sources, one switching element being connected to a negative pole of a last voltage source of the k voltage sources, n nodes to which the (k+1) switching elements are alternately connected, a voltage charging unit in which n capacitors are connected to one another to form a closed loop, and the n nodes are sequentially connected in between the n capacitors, n voltage measuring units that are sequentially connected to both ends of the n capacitors, and a sampling switching unit that is connected between the voltage charging unit and the n voltage measuring units. In this case, the k is a natural number of 2 or more, and the n is a natural number of 3 or more.

In order to achieve the above-described objects, method for battery voltage measurement using the circuit for measuring battery voltage according to the preferred embodiment of the present invention includes a first step of turning on switching elements that are connected to an positive pole and a negative pole of a voltage source among the (k+1) switching elements that become a voltage measurement target, a second step of charging a capacitor among the n capacitors of the voltage charging unit, which has an anode and a cathode to which the turned-on switching elements are connected, in the first step, a third step of turning on the sampling switching unit, and a fourth step of measuring a voltage by using a voltage measuring unit among the n voltage measuring units, which is connected to both ends of the capacitor charged in the second step, and outputting a measured value.

In order to achieve the above-described objects, method for battery voltage measurement using the circuit for measuring battery voltage according to another embodiment of the present invention includes a first step of turning on switching elements among the (k+1) switching elements, which are connected to positive poles and negative poles of a plurality of voltage sources that become voltage measurement targets and are disposed to be adjacent to one another, a second step of charging a plurality of capacitors among the n capacitors of the voltage charging unit, which have anodes and cathodes to which the turned-on switching elements are connected, in the first step, a third step of turning on the sampling switching unit, and a fourth step of measuring voltages by using voltage measuring units among the n voltage measuring units, which is connected to both ends of the plurality of capacitors charged in the second step, and outputting measured values.

ADVANTAGEOUS EFFECTS

Based on the embodiment of the present invention, in the circuit for measuring battery voltage and the method of measuring battery voltage using the same, three or more capacitors, which form a closed loop and are sequentially connected, are provided, and voltages from voltage sources are measured by using the three or more capacitors in turn, accordingly, which prevents measurement errors from occurring due to residual charges in the capacitors and allows a more precise measurement.

Further, according to the present invention, since the three or more capacitors are alternately charged and discharged, the delay in time is decreased, and the voltages from the plurality of voltage sources can be measured at one time. Therefore, it is possible to reduce an amount of time required to measure battery voltage.

BRIEF DESCRIPTION OF THE DRAWINGS

FIG. 1 is a circuit diagram illustrating a circuit for measuring battery voltage according to the related art;

FIG. 2 is a driving timing diagram of the circuit for measuring battery voltage shown in FIG. 1;

FIG. 3 is a circuit diagram illustrating a circuit for measuring battery voltage according to an embodiment of the present invention;

FIG. 4 is a driving timing diagram of the circuit for measuring battery voltage shown in FIG. 3;

FIG. 5 is another driving timing diagram of the circuit for measuring battery voltage shown in FIG. 3; and FIG. 6 is a circuit diagram illustrating a circuit for measuring battery voltage according to another embodiment of the present invention.

MODE FOR THE INVENTION

Hereinafter, the preferred embodiments of the present invention will be described with reference to the accompanying drawings.

A circuit for measuring battery voltage according to an embodiment of the present invention includes a battery that is composed of k (where k is a natural number of 2 or more) voltage sources that are connected in series to one another, (k+1) switching elements, n nodes (where n is a natural number of 3 or more), a voltage charging unit that includes n capacitors, n voltage measuring units, and a sampling switching unit.

First, referring to FIGS. 3 to 5, a description is given of an embodiment of a case where n is set to 3, that is, the number of each of the nodes, the capacitors, and the voltage charging units is three.

As shown in FIG. 3, a circuit for measuring battery voltage is constructed in a state where n is set to 3 in accordance with the embodiment of the present invention. The circuit for measuring battery voltage according to the embodiment of the present invention includes first to eighth voltage sources V1 to V8 that are connected in series to one another, first to ninth switching elements T1 to T9 that are sequentially connected to both ends of the first to eighth voltage sources V1 to V8, a voltage charging unit 30 that includes first to third capacitors 31, 32, and 33 to which the first to ninth switching elements T1 to T9 are connected and which forms a closed loop and are connected sequentially to one another, and first to third voltage measuring units 51, 52, and 53 that measure voltages charged in the first to third capacitors 31, 32, and 33 of the voltage charging unit 30 and output the measured voltage values.

The circuit for measuring battery voltage according to the embodiment of the present invention further includes a sampling switching unit that has first to third sampling switching elements S1 to S3 that are connected between the first to third capacitors 31, 32, and 33 of the voltage charging unit 30 and the first to third voltage measuring units 51, 52, and 53.

One end of each of the first to ninth switching elements T1 to T9 is commonly connected to an positive pole of one of the first to eighth voltage sources V1 to V8 that has the same order as each of the first to ninth switching elements T1 to T9 and a negative pole of one of the voltage sources V1 to V8 that has an order before each of the first to ninth switching elements T1 to T9.

Here, one end of the first switching element T1 that is the first switching element is only connected to an positive pole of the first voltage source V1, and one end of the ninth switching element T9 that is the last switching element is only connected to a negative pole of the eighth voltage source V8.

In addition, the first to ninth switching elements T1 to T9 are alternately connected to the first to third nodes N1 to N3.

That is, among the first to ninth switching elements T1 to T9, the first, fourth, and seventh switching elements T1, T4, and T7 are connected to the first node N1, the second, fifth, and eighth switching elements T2, T5, and T8 are connected to the second node N2, and the third, sixth, and ninth switching elements T3, T6, and T9 are connected to the third node N3.

In addition, the first node N1 is commonly connected to a (+) terminal of the first capacitor 31 and a (−) terminal of the second capacitor 32, the second node N2 is commonly connected to a (+) terminal of the second capacitor 32 and a (−) terminal of the third capacitor 33, and the third node N3 is commonly connected to a (+) terminal of the third capacitor 33 and a (−) terminal of the first capacitor 31.

In the first to third sampling switching elements S1 to S3 of the sampling switching unit, each sampling switching element has one end that is sequentially connected to one end of each of the first to third capacitors 31, 32, and 33 and the other end that is commonly connected to a first terminal (any one of a (+) terminal and a (−) terminal) of the voltage measuring unit having the same order as each sampling switching element and a second terminal (the other of a (+) terminal or a (−) terminal) of the voltage measuring unit having an order before each sampling switching element. However, the other end of the first sampling switching element S1 is constructed to be commonly connected to a first terminal of the voltage measuring unit having the same order as the first sampling switching element S1 and a second terminal of the last voltage measuring unit.

That is, the first sampling switching element S1 connects the (+) terminal of the first capacitor 31 and the (+) terminal of the first voltage measuring unit 51 and connects the (−) terminal of the third capacitor 33 and the (−) terminal of the third voltage measuring circuit 53.

In addition, the second sampling switching element S2 connects the (+) terminal of the second capacitor 32 and the (+) terminal of the second voltage measuring unit 52 and connects the (−) terminal of the first capacitor 31 and the (−) terminal of the first voltage measuring circuit 51.

Further, the third sampling switching element S3 connects the (+) terminal of the third capacitor 33 and the (+) terminal of the third voltage measuring unit 53 and connects the (−) terminal of the second capacitor 32 and the (−) terminal of the second voltage measuring circuit 52.

Referring to FIG. 4, a description is given of an embodiment of a method of measuring battery voltage using the circuit for measuring a battery voltage according to the embodiment of the present invention that is constructed in the above-described method.

First, the first and second switching elements T1 and T2 are turned on. As a result, the positive voltage of the first voltage source V1 is applied to the first node N1 to which the first switching element T1 is connected, and the negative voltage of the first voltage source V1 is applied to the second node N2 to which the second switching element T2 is connected.

Therefore, the positive voltage of the first voltage source V1 is applied to the (+) terminal of the first capacitor 31 that is connected to the first node N1, and the negative voltage of the first voltage source V1 is applied to the (−) terminal of the first capacitor 31 that is connected to the second node N2. As a result, the voltage of the first voltage source V1 is charged into the first capacitor 31.

Then, the first and second sampling switching elements S1 and S2 are turned on, and the voltage of the first voltage source V1 is measured by the first voltage measuring unit 51. At this time, the first and second switching elements T1 and T2 are turned off such that the voltage is not applied to the first capacitor 31, thereby discharging the first capacitor 31.

Here, the reason why the capacitor is discharged is to continuously measure the voltages of the other voltage sources. Accordingly, in the case where the voltages from the voltage sources of the battery are not sequentially and continuously measured but only the voltage from the specific voltage source is measured, it is unnecessary to perform a process of turning off the switching elements at the same time as the voltage measurement so as to discharge the capacitor. As a result, the process may be omitted. For reference, the voltage that is charged into the capacitor is discharged naturally over time.

Then, the second and third switching elements T2 and T3 are turned on. As a result, the positive voltage of the second voltage source V2 is applied to the second node N2 to which the second switching element T2 is connected, and the negative voltage of the second voltage source V2 is applied to the third node N3 to which the third switching element T3 is connected.

Accordingly, the positive voltage of the second voltage source V2 is applied to the (+) terminal of the second capacitor 32 that is connected to the second node N2, and the negative voltage of the second voltage source V2 is applied to the (−) terminal of the second capacitor 32 that is connected to the third node N3. As a result, the voltage of the second voltage source V2 is charged into the second capacitor 32.

Then, the second and third sampling switching elements S2 and S3 are turned on, and the voltage of the second voltage source V2 is measured by the second voltage measuring unit 52. At this time, the second and third switching elements T2 and T3 are turned off such that the voltage is not applied to the second capacitor 32, thereby discharging the second capacitor 32.

Then, the third and fourth switching elements T3 and T4 are turned on. As a result, the positive voltage of the third voltage source V3 is applied to the third node N3 to which the third switching element T3 is connected, and the negative voltage of the third voltage source V3 is applied to the first node N1 to which the fourth switching element T4 is connected, Accordingly, the positive voltage of the third voltage source V3 is applied to the (+) terminal of the third capacitor 33 that is connected to the third node N3, and the negative voltage of the third voltage source V3 is applied to the (−) terminal of the third capacitor 33 that is connected to the first node N1. As a result, the voltage of the third voltage source V3 is charged into the third capacitor 33.

Then, the third and first sampling switching elements S3 and S1 are turned on, and the voltage of the third voltage source V3 is measured by the third voltage measuring unit 53. At this time, the third and fourth switching elements T3 and T4 are turned off such that the voltage is not applied to the third capacitor 33, thereby discharging the third capacitor 33.

According to the method of measuring a battery voltage according to the embodiment of the present invention, the above-described processes are sequentially performed, and the voltages of the first to eighth voltage sources V1 to V8 are sequentially measured.

The total voltage that is charged into the battery can be calculated by summing the measured voltages of the first to eighth voltage sources V1 to V8. For example, the measured voltages of the voltage sources can be summed by using a logic element or a microcomputer, which can be apparently understood by those skilled in the art. Therefore, the specific description will be omitted.

According to the circuit for measuring battery voltage and the method of measuring a battery voltage using the same according to the embodiment of the present invention as described above, the circuit for measuring a battery voltage includes the first to third capacitors 31, 32, and 33 to which the first to ninth switching elements T1 to T9 are connected and which form a closed loop and are sequentially connected to one another. Therefore, it is possible to measure the voltages of the first to eighth voltage sources V1 to V8.

Accordingly, since the circuit for measuring battery voltage according to the embodiment of the present invention measures the voltages of the voltage sources by using the three or more capacitors in turn, the circuit for measuring battery voltage can prevent measurement errors from occurring due to the residual charges in the capacitors, thereby obtaining an accurate measurement. Further, in this invention, since the three or more capacitors are alternately charged and discharged, the delay in time is decreased, and as a result, it is thus possible to reduce the amount of time required to measure the battery voltage.

In the method of measuring battery voltage according to the embodiment of the present invention, as described above, the voltages of the first to eighth voltage sources V1 to V8 may be sequentially measured one at a time, and the voltages of the first to eighth voltage sources V1 to V8 may be sequentially measured two at a time. Hereinafter, the method of sequentially measuring the voltages of the voltage sources two at a time will be described.

As shown in FIG. 5, first, the first to third switching elements T1 to T3 are turned on.

As a result, the positive voltage of the first voltage source V1 is applied to the first node N1 to which the first switching element T1 is connected, the negative voltage of the first voltage source V1 and the positive voltage of the second voltage source V2 are applied to the second node N2 and the third node N3 to which the second switching element T2 is connected, and the negative voltage of the second voltage source V2 is applied to the third node N3 to which the third switching element T3 is connected.

Accordingly, the positive voltage of the first voltage source V1 is applied to the (+) terminal of the first capacitor 31 that is connected to the first node N1, the negative voltage of the first voltage source V1 is applied to the (−) terminal of the first capacitor 31 that is connected to the second node N2, the positive voltage of the second voltage source V2 is applied to the (+) terminal of the second capacitor 32, and the negative voltage of the second voltage source V2 is applied to the (−) terminal of the second capacitor 32 that is connected to the third node N3. As a result, the voltage of the first voltage source V1 is charged into the first capacitor 31, and the voltage of the second voltage source V2 is charged into the second capacitor 32.

Then, the first to third sampling switching elements S1 to S3 are turned on, and the voltages of the first and second voltage sources V1 and V2 are measured by the first and second voltage measuring units 51 and 52.

At this time, the first to third switching elements T1 to T3 are turned off such that the voltage is not applied to the first and second capacitors 31 and 32, thereby discharging the first and second capacitors 31 and 32.

Here, the reason why the capacitor is discharged is to continuously measure the voltages of the other voltage sources. Accordingly, in the case where the voltages of the voltage sources of the battery are not sequentially and continuously measured, but only voltages from two specific voltage sources are measured, it is unnecessary to perform a process of turning off the switching elements at the same time as the voltage measurement so as to discharge the capacitor. As a result, the process may be omitted. For reference, the voltage that is charged into the capacitors is discharged naturally over time.

Then, the third to fifth switching elements T3 to T5 are turned on. As a result, the positive voltage of the third voltage source V3 is applied to the third node N3 to which the third switching element T3 is connected, the negative voltage of the third voltage source V3 and the positive voltage of the fourth voltage source V4 are applied to the first node N1 and the second node N2 to which the fourth switching element T4 is connected, and the negative voltage of the fourth voltage source V4 is applied to the second node N2 to which the fifth switching element T5 is connected.

Accordingly, the positive voltage of the third voltage source V3 is applied to the (+) terminal of the third capacitor 33 that is connected to the third node N3, the negative voltage of the third voltage source V3 is applied to the (−) terminal of the third capacitor 33 that is connected to the first node N1, the positive voltage of the fourth voltage source V4 is applied to the (+) terminal of the first capacitor 31, and the negative voltage of the fourth voltage source V4 is applied to the (−) terminal of the first capacitor 31 that is connected to the second node N2. As a result, the voltage of the third voltage source V3 is charged into the third capacitor 33 and the voltage of the fourth voltage source V4 is charged in the first capacitor 31.

Then, the first to third sampling switching elements S1 to S3 are turned on, and the voltages of the third and fourth voltage sources V3 and V4 are measured by the third and first voltage measuring units 53 and 51. At this time, the third to fifth switching elements T3 to T5 are turned off such that the voltage is not applied to the first and third capacitors 31 and 33, thereby discharging the first and third capacitors 31 and 33.

According to the method of measuring battery voltage according to the embodiment of the present invention, the voltages of the first to eighth voltage sources V1 to V8 are sequentially measured two at a time, and thus the amount of time required to measure the battery voltage can be reduced, as compared with the method of measuring battery voltage according to the related art.

Then, referring to FIG. 6, a description is given of an embodiment of a case where n is set to 4, that is, the number of each of nodes, capacitors, and voltage charging units is four.

Referring to FIG. 6, a circuit for measuring battery voltage according to another embodiment of the present invention includes first to seventh voltage sources V1 to V7 that are connected in series to one another, first to eighth switching elements T1 to T8 that are sequentially connected to both ends of the first to seventh voltage sources V1 to V7, a voltage charging unit 130 that includes first to fourth capacitors 131, 132, 133, and 134 to which the first to eighth switching elements T1 to T8 are connected and which form a closed loop and are sequentially connected to one another, and first to fourth voltage measuring units 151, 152, 153, and 154 that measure voltages charged into the first to fourth capacitors 131, 132, 133, and 134 of the voltage charging unit 130.

Further, the circuit for measuring battery voltage according to another embodiment of the present invention further includes a sampling switching unit that includes first to fourth sampling switching elements S1 to S4 connected between the first to fourth capacitors 131, 132, 133, and 134 of the voltage charging unit 130 and the first to fourth voltage measuring units 151, 152, 153, and 154.

One end of each of the first to eighth switching elements T1 to T8 is commonly connected to an positive pole of one of the first to seventh voltage sources V1 to V7 that have the same order as each of the first to eighth switching elements T1 to T8 and a negative pole of one of the voltage sources V1 to V7 that have an order before each of the first to eighth switching elements T1 to T8.

Here, one end of the first switching element T1 that is the first switching element is only connected to an positive pole of the first voltage source V1, and one end of the eighth switching element T8 that is the last switching element is only connected to a negative pole of the seventh voltage source V7.

In addition, the first to eighth switching elements T1 to T8 are alternately connected to the first to fourth nodes N1 to N4.

That is, among the first to eighth switching elements T1 to T8, the first and fifth switching elements T1 and T5 are connected to the first node N1, the second and sixth switching elements T2 and T6 are connected to the second node N2, the third and seventh switching elements T3 and T7 are connected to the third node N3, and the fourth and eighth switching elements T4 and T8 are connected to the fourth node N4.

In addition, the first node N1 is commonly connected to a (+) terminal of the first capacitor 131 and a (−) terminal of the second capacitor 132, the second node N2 is commonly connected to a (+) terminal of the second capacitor 132 and a (−) terminal of the third capacitor 133, the third node N3 is commonly connected to a (+) terminal of the third capacitor 133 and a (−) terminal of the fourth capacitor 134, and the fourth node N4 is commonly connected to the (+) terminal of the fourth capacitor 134 and the (−) terminal of the first capacitor 131.

In the first to fourth sampling switching elements S1 to S4 of the sampling switching unit, each sampling switching element has one end that is sequentially connected to one end of each of the first to fourth capacitors 131, 132, 133, and 134 and the other end that is commonly connected to a first terminal (any one of a (+) terminal and a (−) terminal) of the voltage measuring unit having the same order as each sampling switching element and a second terminal (the other of a (+) terminal or a (−) terminal) of the voltage measuring unit having an order before each sampling switching element. However, the other end of the first sampling switching element S1 is constructed to be commonly connected to a first terminal of the voltage measuring unit having the same order as the first sampling switching element S1 and a second terminal of the last voltage measuring unit.

That is, the first sampling switching element S1 connects the (+) terminal of the first capacitor 131 and the (+) terminal of the first voltage measuring unit 151 and connects the (−) terminal of the fourth capacitor 134 and the (−) terminal of the fourth voltage measuring unit 154.

The second sampling switching element S2 connects the (+) terminal of the second capacitor 132 and the (+) terminal of the second voltage measuring unit 152 and connects the (−) terminal of the first capacitor 131 and the (−) terminal of the first voltage measuring unit 151.

The third sampling switching element S3 connects the (+) terminal of the third capacitor 133 and the (+) terminal of the third voltage measuring unit 153 and connects the (−) terminal of the second capacitor 132 and the (−) terminal of the second voltage measuring unit 152.

The fourth sampling switching element S4 connects the (+) terminal of the fourth capacitor 134 and the (+) terminal of the fourth voltage measuring unit 154 and connects the (−) terminal of the third capacitor 133 and the (−) terminal of the third voltage measuring unit 153.

According to the method of measuring battery voltage using the circuit for measuring a battery voltage according to another embodiment of the present invention shown in FIG. 6, the voltages of the first to seventh voltage sources V1 to V7 may be sequentially measured one at a time or the voltages of the first to seventh voltage sources V1 to V7 may be sequentially measured two at a time, in the same manner as the method of measuring battery voltage having been described with reference to FIGS. 3 to 5. In order to avoid repetitive description, the specific operation description thereof will be omitted.

Further, the method of measuring battery voltage using the circuit for measuring a battery voltage according to another embodiment of the present invention as shown in FIG. 6 applies the method of measuring voltages two at a time, as described with reference to FIG. 5, and may sequentially measure the voltages of the first to seventh voltage sources three at a time V1 to V7.

For example, the first to fourth switching elements T1 to T4 may be turned on and the voltages of the first to third voltage sources V1 to V3 may be charged into the first to third capacitors 131, 132, and 133 and then the first to fourth sampling switching elements S1 to S4 may be turned on and the voltages of the first to third voltage sources V1 to V3 charged into the first to third capacitors 131, 132, and 133 may be measured by the first to third voltage measuring units 151, 152, and 153. At this time, when wanting to sequentially measure the voltages of other three voltage sources, it is necessary to perform a process of turning off the first to fourth switching elements T1 to T4 so as to discharge the first to third capacitors 131, 132, and 133.

As described above, according to the method of measuring battery voltage using the circuit for measuring battery voltage according to another embodiment of the present invention, the voltages of the voltage sources may be simultaneously measured two at a time or three at a time. Therefore, it is possible to further reduce the amount of time required to measure the battery voltage, as compared with the method of measuring battery voltage according to the related art.

Meanwhile, in the embodiment and another embodiment of the present invention, the cases have been exemplified in which the eight voltage sources and the seven voltage sources are respectively used. However, the present invention is not limited thereto, and the present invention may be applied to all cases where two or more voltage sources are used, regardless of the number of voltage sources.

The invention claimed is:

1. Circuit for measuring battery voltage comprising:
    a battery that is composed of k voltage sources that are connected in series to one another;
    (k+1) switching elements, includes the k switching elements being sequentially connected to positive poles of the k voltage sources, one switching element being connected to a negative pole of a last voltage source of the k voltage sources;
    n nodes to which the (k+1) switching elements are alternately connected;
    a voltage charging unit in which n capacitors are connected to one another to form a closed loop, and the n nodes are sequentially connected in between the n capacitors;
    n voltage measuring units that are sequentially connected to both ends of the n capacitors; and
    a sampling switching unit that is connected between the voltage charging unit and the n voltage measuring units,
    wherein the k is a natural number of 2 or more, and the n is a natural number of 3 or more.

2. The circuit according to claim 1, wherein the sampling switching unit includes n sampling switching elements that are sequentially disposed, each of the n sampling switching elements has one end that is sequentially connected to one end of the n capacitors and the other end that is commonly connected to a first terminal of a voltage measuring unit having the same order as each of the n sampling switching elements and a second terminal of a voltage measuring unit having an order before each of the n sampling switching elements, and the other end of a first sampling switching element is commonly connected to a first terminal of a voltage measuring unit having the same order as the first sampling switching element and a second terminal of a last voltage measuring unit.

3. Method for battery voltage measurement using the circuit for measuring battery voltage according to claim 1, the method comprising:
- a first step of turning on switching elements that are connected to an positive pole and a negative pole of a voltage source among the (k+1) switching elements that become a voltage measurement target;
- a second step of charging a capacitor among the n capacitors of the voltage charging unit, which has an anode and a cathode to which the turned-on switching elements are connected, in the first step;
- a third step of turning on the sampling switching unit; and
- a fourth step of measuring a voltage by a voltage charging unit among the n voltage measuring units, which is connected to both ends of the capacitor charged in the second step, and outputting a measured value.

4. The method according to claim 3, wherein a process including the first to fourth steps proceeds to be sequentially applied to all the k voltage sources.

5. The method according to claim 3, after the second step, further comprising: a step of turning off the switching elements that are connected to the positive pole and the negative pole of the voltage source becoming the voltage measurement target.

6. Method for battery voltage measurement using the circuit for measuring battery voltage according to claim 1, the method comprising:
- a first step of turning on switching elements among the (k+1) switching elements, which are connected to positive poles and negative poles of a plurality of voltage sources that become voltage measurement targets and are disposed to be adjacent to one another;
- a second step of charging a plurality of capacitors among the n capacitors of the voltage charging unit, which have anodes and cathodes to which the turned-on switching elements are connected, in the first step;
- a third step of turning on the sampling switching unit; and
- a fourth step of measuring voltages by using voltage measuring units among the n voltage measuring units, which is connected to both ends of the plurality of capacitors charged in the second step, and outputting measured values.

7. The method according to claim 6, wherein a process including the first to fourth steps proceeds to be sequentially applied to all the k voltage sources.

8. The method according to claim 6, further comprising, after the second step: a step of turning off the switching elements that are connected to the positive poles and the negative poles of the plurality of voltage sources becoming the voltage measurement targets.

* * * * *